United States Patent
Fujisawa

(10) Patent No.: US 7,262,124 B2
(45) Date of Patent: Aug. 28, 2007

(54) WIRE LOOP, SEMICONDUCTOR DEVICE HAVING SAME, WIRE BONDING METHOD AND WIRE BONDING APPARATUS

(75) Inventor: Hiromi Fujisawa, Tokyo (JP)

(73) Assignee: Kaijo Corporation, Tokyo (JP)

( * ) Notice: Subject to any disclaimer, the term of this patent is extended or adjusted under 35 U.S.C. 154(b) by 143 days.

(21) Appl. No.: 11/113,690

(22) Filed: Apr. 25, 2005

(65) Prior Publication Data

US 2005/0189567 A1 Sep. 1, 2005

Related U.S. Application Data

(62) Division of application No. 10/715,990, filed on Nov. 18, 2003, now Pat. No. 6,933,608.

(30) Foreign Application Priority Data

Nov. 21, 2002 (JP) ............................ 2002-338296

(51) Int. Cl.
*H01L 21/60* (2006.01)
*B23K 101/40* (2006.01)
*B23K 1/00* (2006.01)

(52) U.S. Cl. ............... 438/617; 257/784; 257/E23.024; 228/904

(58) Field of Classification Search ................ 438/617; 228/904

See application file for complete search history.

(56) References Cited

U.S. PATENT DOCUMENTS

| 5,299,729 A | 4/1994 | Matsushita et al. |
|---|---|---|
| 5,566,876 A | 10/1996 | Nishimaki et al. |
| 5,735,030 A | 4/1998 | Orcutt |
| 6,036,080 A | 3/2000 | Takahashi et al. |
| 6,062,462 A | 5/2000 | Gillotti et al. |
| 6,079,610 A | 6/2000 | Maeda et al. |
| 6,080,651 A | 6/2000 | Takahashi et al. |
| 6,268,662 B1 | 7/2001 | Test et al. |
| 6,315,190 B1 | 11/2001 | Nishiura |
| 6,815,836 B2 | 11/2004 | Ano |
| 2001/0002624 A1 | 6/2001 | Khandros et al. |
| 2002/0050653 A1 | 5/2002 | Masumoto et al. |

FOREIGN PATENT DOCUMENTS

| EP | 0 753 891 A2 | 1/1997 |
|---|---|---|
| JP | 03183139 | 9/1991 |
| JP | 04-273135 | 9/1992 |
| JP | 06-132347 | 5/1994 |

(Continued)

*Primary Examiner*—Andy Huynh
*Assistant Examiner*—Earl Taylor

(57) ABSTRACT

A wire loop comprises a wire connecting a first bonding point and a second bonding point therethrough, wherein the wire has a crushed part formed therein by crushing the part of the wire and a top of a ball bonded to the first bonding point with a capillary. The wire loop is formed by a wire bonding method which includes: bonding the wire to the first bonding point; moving the capillary horizontally and vertically while carrying out loop control; bonding the wire to the vicinity of the top of the ball bonded to the first bonding point; and thereafter, moving the capillary horizontally and vertically to the second bonding point while delivering the wire and carrying out loop control, and then bonding the wire to the second bonding point.

13 Claims, 7 Drawing Sheets

FOREIGN PATENT DOCUMENTS

| | | |
|---|---|---|
| JP | 9-51011 | 2/1997 |
| JP | 09051011 A * | 2/1997 |
| JP | 10-199916 | 7/1998 |
| JP | 2000-36512 | 2/2000 |
| JP | 2000-277558 | 6/2000 |
| JP | 2004-172477 | 6/2004 |

* cited by examiner

WIRE LOOP, SEMICONDUCTOR DEVICE HAVING SAME, WIRE BONDING METHOD AND WIRE BONDING APPARATUS

CROSS-REFERENCE TO RELATED APPLICATION

This application is a divisional application of U.S. patent application Ser. No. 10/715,990 filed Nov. 18, 2003, now U.S. Pat. No. 6,933,608.

BACKGROUND OF THE INVENTION

1. Field of the Invention

The present invention relates to a wire bonding method for connecting a first bonding point and a second bonding point through a wire, a wire bonding apparatus for carrying out the method, a wire loop having a certain shape and a semiconductor device having such a wire loop incorporated therein.

2. Description of the Related Art

Conventionally, in a process of fabricating a semiconductor device, as shown in FIG. 7A or 7B, wire bonding for connecting a pad 2a or a first bonding point A of a semiconductor chip 2 attached to a lead frame 1 and a lead 1a or a second bonding point Z of the lead frame 1 through a wire 3 has been carried out. Typically, loop shapes of the wire 3 connecting the first and second bonding points A and Z include a trapezoidal shape and a triangular shape shown in FIGS. 7A and 7B, respectively, as disclosed, for example, in U.S. Pat. No. 6,036,080 or Japanese Patent Application Laid-Open Publication No. 2000-277558.

The wire loop having a trapezoidal shape shown in 7A is formed by a sequence of steps as shown in FIG. 8. First, in step (a) of FIG. 8, a capillary 4 through which the wire 3 passes is lowered and a ball 30 which has been formed at a tip end of the wire 3 is bonded to the pad 2a of the chip 2 or first bonding point A. Then, in step (b) of FIG. 8, the capillary 4 is vertically raised to a point B while the wire 3 is delivered. Thereafter, in step (c) of FIG. 8, the capillary 4 is horizontally moved to a point C in a direction opposite from the second bonding point Z.

In general, such an operation of the capillary 4 to be moved in the direction opposite from the second bonding point Z is referred to as a "reverse operation". As a result, the portion of the wire 3 between the points A and C is formed to be inclined and the wire 3 is formed at an upper end of the inclined portion thereof with a kink 3a by a lower end of the capillary 4. The portion of the wire 3 between the points A and C thus delivered corresponds to the height of a neck portion H (or a portion of the wire 3 between the pad 2a and the kink 3a) and will constitute the neck portion H.

Subsequently, in step (d) of FIG. 8, the capillary 4 is vertically raised to a point D while the wire 3 is delivered. Then, in step (e) of FIG. 8, the reverse operation of the capillary 4 is performed again, i.e. the capillary 4 is horizontally moved to a point E in the direction opposite from the second bonding point Z. As the result of this reverse operation, the wire 3 has another inclined portion extending between the points C and E, and a kink 3b is formed in an upper end of this inclined portion of the wire 3.

This inclined portion of the wire 3 thus delivered will constitute an upper base portion L (or a portion of the wire 3 between the kinks 3a and 3b) of the wire loop having a trapezoidal shape shown in FIG. 7A. Thereafter, in step (f) of FIG. 8, the capillary 4 is vertically raised to a point F so that the wire 3 is delivered by a length corresponding to a long inclined portion S (or a portion of the wire 3 between the kink 3b and the lead 1a) of the wire loop shown in FIG. 7A. Subsequently, the capillary 4 is lowered to the second bonding point Z via positions $f_1$ and $f_2$, so that the wire 3 is bonded to the second bonding point Z or the lead 1a.

The wire loop having a triangular shape shown in 7B is formed by a sequence of steps as shown in FIG. 9. Since the wire loop having a triangular shape is not provided with an upper base portion (L) unlike the wire loop having a trapezoidal shape described above, in forming the wire loop of a triangular shape, the second reverse operation in steps (d) and (e) of FIG. 8 is not conducted. Therefore, in this instance, a step that corresponds to the steps (d), (e) and (f except for $f_1$ and $f_2$) of FIG. 8 is carried out only in step (d) of FIG. 9. More particularly, steps (a), (b) and (c) of FIG. 9 are the same as the steps (a), (b) and (c) of FIG. 8, and after the first reverse operation in step (c) of FIG. 9, the capillary 4 is vertically raised to a point F in step (d) of FIG. 9 while the wire 3 is delivered. Subsequently, in step (e) of FIG. 9, the capillary 4 is moved via positions $e_1$ and $e_2$ in a manner similar to that in step (f) of FIG. 8, with the result that the wire 3 is bonded to the second bonding point Z or the lead 1a.

However, in the above-described techniques, as the wire loop includes the neck portion H having a somewhat large height, the wire loop becomes high and thus is rendered to be unstable. In addition, in a case where a wire loop is formed without any reverse operation of the capillary in order to make the height of a neck portion H thereof small and the height of the neck portion H is reduced to a certain level or below, the neck portion H is liable to be damaged in drawing or moving the wire 3 to arrange it in place because of the wire 3 vertically extending from the first bonding point A.

SUMMARY OF THE INVENTION

The present invention has been made in view of the foregoing disadvantages of the prior art.

Accordingly, it is an object of the present invention to provide a wire loop having a low profile which is stable and of which a neck portion is hard to be damaged.

It is another object of the present invention to provide a semiconductor device having said wire loop incorporated therein.

It is still another object of the present invention to provide a wire bonding method capable of forming said wire loop.

It is a further object of the present invention to provide a wire bonding apparatus capable of carrying out said wire bonding method.

In accordance with one aspect of the present invention, a wire loop is provided. The wire loop comprises: a wire connecting a first bonding point and a second bonding point therethrough; the wire including a ball bonded to the first bonding point, a neck portion adjacent to the ball and a major portion extending from the neck portion to the second bonding point; wherein the major portion of the wire has a crushed part formed in proximity to the neck portion by crushing the part of the wire together with a top portion of the ball.

In a preferred embodiment of the present invention, the neck portion includes a first kink formed by a part of the neck portion being doubled over.

In a preferred embodiment of the present invention, the major portion of the wire includes a horizontal portion extending in a substantially horizontal direction from the neck portion and an inclined portion which extends from the horizontal portion to the second bonding point and which has an end thereof bonded to the second bonding point; and the inclined portion is connected to the horizontal portion through a second kink formed in a part of the wire therebetween.

In a preferred embodiment of the present invention, the neck portion includes at least one additional doubled over kink like the first kink.

In accordance with another aspect of the present invention, a wire bonding method for bonding a wire between a first bonding point and a second bonding point using a capillary is provided. The wire bonding method comprises the steps of:

bonding a ball formed on a tip end of the wire to the first bonding point;

moving the capillary horizontally and vertically while carrying out loop control, to thereby form a kink in a neck portion of the wire adjacent to the ball;

bonding the wire to a top or the vicinity of the top of the ball bonded to the first bonding point; and thereafter, moving the capillary horizontally and vertically to the second bonding point while delivering the wire from the capillary and carrying out loop control, and then bonding the wire to the second bonding point; wherein the step includes crushing a part of the wire and the top of the ball with the capillary to form a crushed part in the wire.

In a preferred embodiment of the present invention, in the steps (b) and (c), the neck portion of the wire is doubled over to form the kink.

In a preferred embodiment of the present invention, the steps (b) and (c) are repeatedly carried out a plurality of times to form at least one additional doubled over kink in the neck portion.

In a preferred embodiment of the present invention, the step (d) includes operating the capillary to form an additional kink in a portion of the wire located between the crushed part and the second bonding point.

In accordance with still another aspect of the present invention, a wire bonding apparatus for carrying out the wire bonding method is provided. The wire bonding apparatus comprises: a capillary having the wire inserted therethrough to deliver the wire from the capillary; a clamp for releasably clamping the wire; a moving means for moving the capillary horizontally and vertically; a control unit for controlling the movement of the capillary; and a means for manually inputting height of the capillary to be raised into the control unit, whereby the movement of the capillary is automatically controlled.

In accordance with a further aspect of the present invention, a semiconductor device is provided. The semiconductor device comprises: a first bonding point; a second bonding point; a wire bonded to the first bonding point and the second bonding point to connect the first bonding point and the second bonding point therethrough; wherein the wire includes a ball bonded to the first bonding point, a neck portion adjacent to the ball and a major portion extending from the neck portion to the second bonding point; and wherein the major portion of the wire has a crushed part formed in proximity to the neck portion by crushing the part of the wire together with a top portion of the ball.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE INVENTION

Figure 1A:
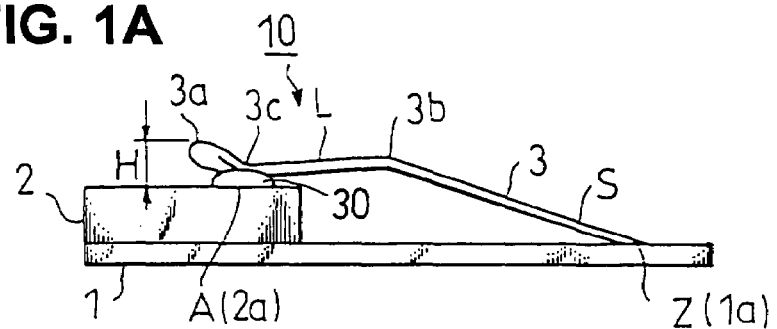
FIG. 1A is an elevational view showing a shape of an embodiment of a wire loop in a semiconductor device according to the present invention.

Now, a wire loop, a semiconductor device, a wire bonding method and a wire bonding apparatus according to the present invention will be described hereinafter with reference to the accompanying drawings in which like parts in each of the several figures are identified by the same reference character or numeral.

Figure 1B:
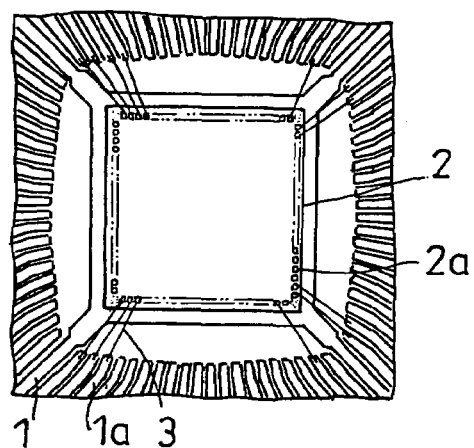
FIG. 1B is a fragmentary schematic plan view showing the semiconductor device.

Referring first to FIGS. 1A and 1B, an embodiment of a wire loop and a semiconductor device 10 having the wire loop incorporated therein according to the present invention is illustrated. In the semiconductor device 10, a semiconductor chip 2 is attached to a lead frame 1 and is provided thereon with a pad 2a which is a first bonding point A. The wire loop of a wire 3 is formed to have a trapezoidal shape in general and includes a neck portion H having a ball 30 bonded to the pad 2a or first bonding point A and a major portion consisting of a horizontal upper portion L and an inclined portion S which has an end bonded to a lead 1a of the lead frame 1 or a second bonding point Z. The horizontal upper portion L of the wire loop is provided at the opposite ends thereof with kinks 3a and 3b.

Such construction of the illustrated embodiment is approximately the same as that of a conventional semiconductor device. However, in the illustrated embodiment, a crushed part 3c is formed in the wire 3 in the vicinity of the first bonding point A. More specifically, the crushed part 3c is formed in the horizontal upper portion L of the wire 3 adjacent to the kink 3a by crushing the part of the wire 3 together with a top portion of the ball 30. As the wire loop has the crushed part 3c thus formed adjacent to the kink 3a, the kink 3*a* is stably deformed, resulting in the wire loop having a low profile and exhibiting a strong shape retention.

Figure 2:
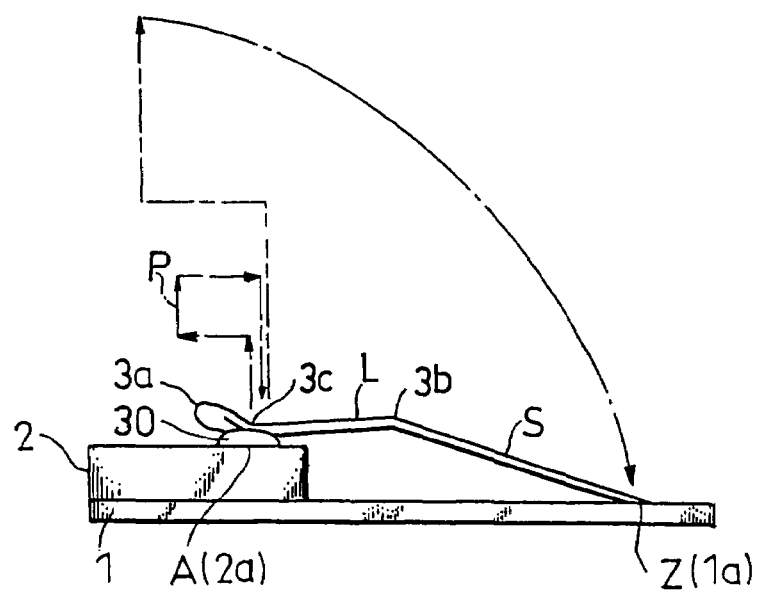
FIG. 2 is a schematic elevational view showing a moving path of a capillary to form the wire loop having a shape shown in FIG. 1 and a state of connection of the wire loop.
Figure 3:
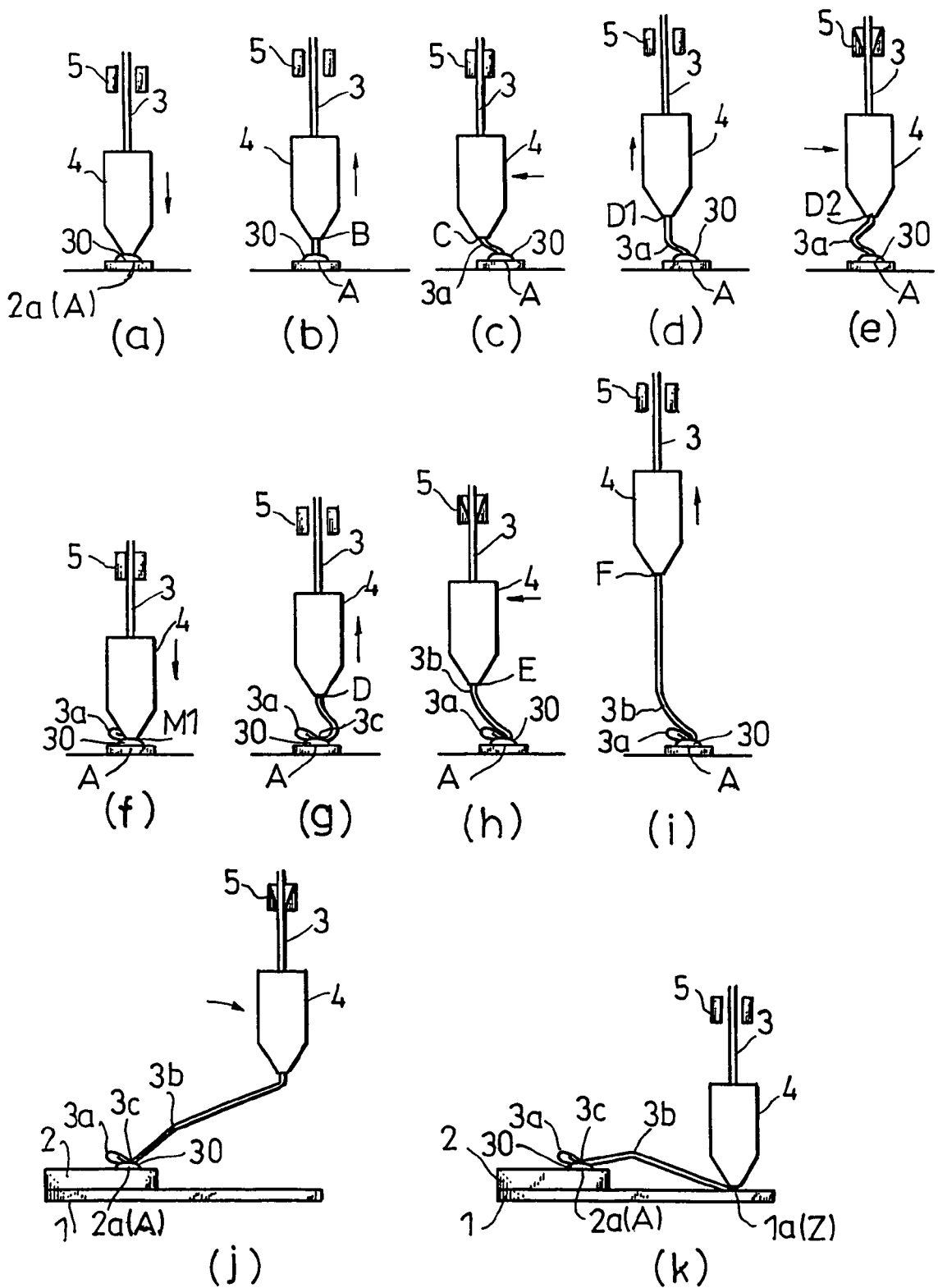
FIG. 3 is a schematic diagram showing wire shapes in respective steps in association with the movement of the capillary according to a method of the present invention by way of example.

Referring now to FIGS. 2 and 3, an embodiment of the wire bonding method according to the present invention by which the semiconductor device 10 shown in FIGS. 1A and 1B is obtained will be described.

Figure 8:
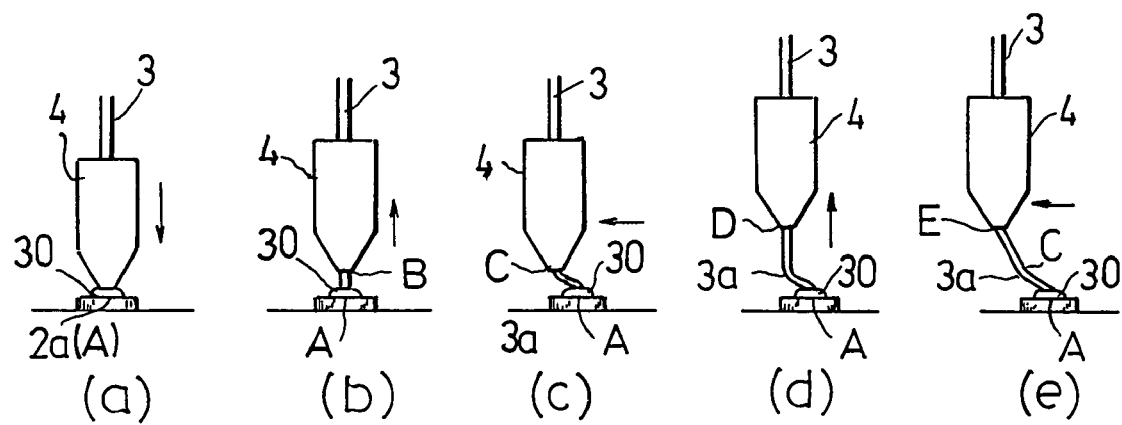
FIG. 8 is a schematic diagram showing wire shapes in respective steps in association with the movement of the capillary to form the wire loop of a trapezoidal shape shown in FIG. 7A.
Figure 8:
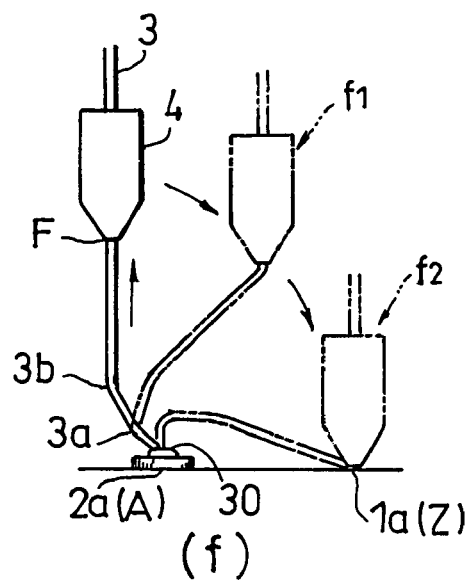
Figure 9:
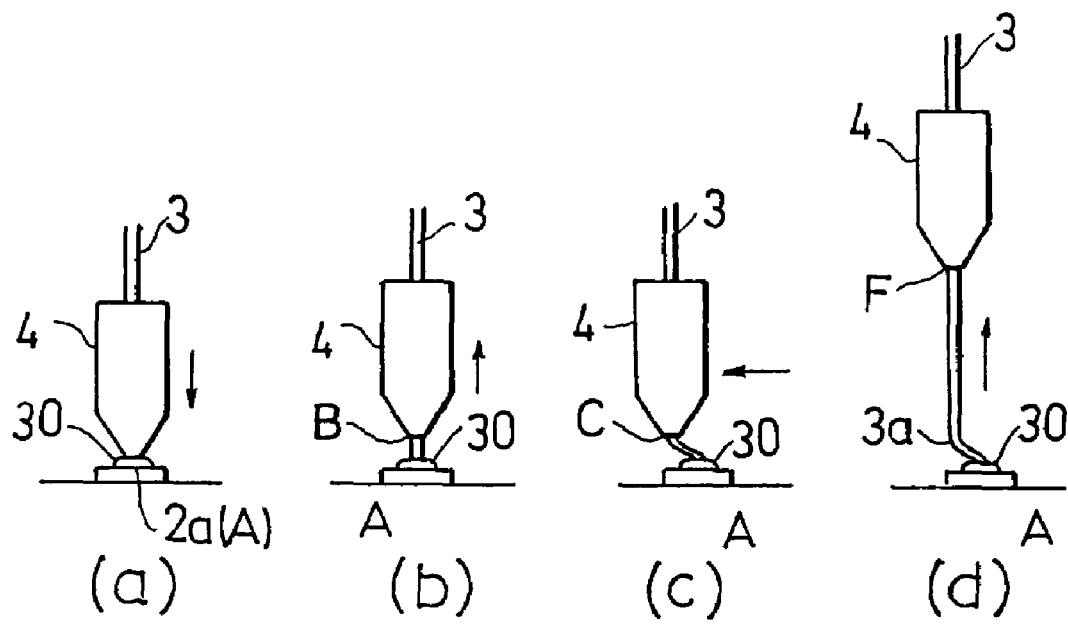
FIG. 9 is a schematic diagram showing wire shapes in respective steps in association with the movement of the capillary to form the wire loop of a triangular shape shown in FIG. 7B.
Figure 9:
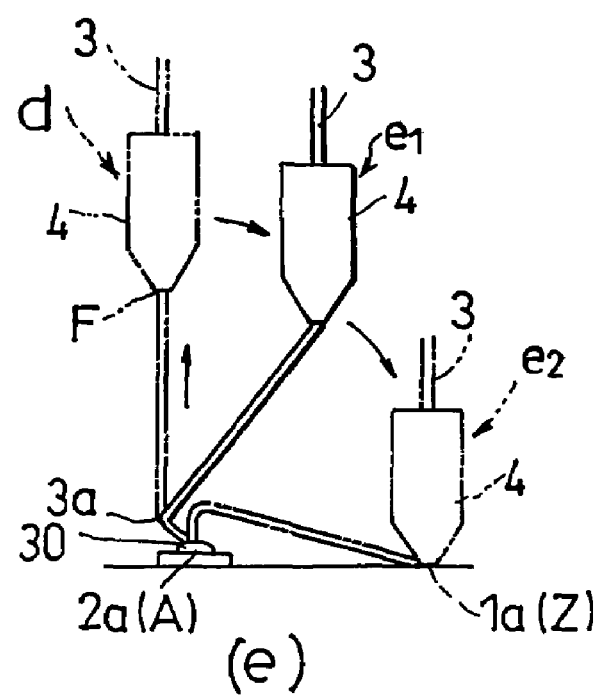

FIG. 2 shows a moving path P of a capillary 4 and a finished state of the wire loop connected to the first and second bonding points A and Z by wire bonding. As compared to the conventional method shown in FIG. 8, the illustrated embodiment of the wire bonding method further includes steps (e) and (f) of FIG. 3 which are carried out between steps (d) and (e) of FIG. 8. The remaining steps of FIG. 3 are the same as those of FIG. 8, i.e. steps (a) to (d) and steps (g) to (k) of FIG. 3 correspond to the steps (a) to (d) and the steps (e) and (f [via positions $f_1$ and $f_2$]) of FIG. 8.

First, steps (a) to (d) of FIG. 3, which are the same as those in the conventional method, will be described. In FIG. 3, a clamp 5 used for clamping a wire 3 and releasing the same is illustrated in such a manner that a closed state of the clamp 5 and an open state thereof are indicated by contacting the clamp 5 with the wire 3 and by separating it from the wire 3, respectively, and that a case in which the clamp 5 may be kept in either the closed state or open state is indicated by diagonal lines added in the clamp 5. In step (a) of FIG. 3, the capillary 4 is lowered while the clamp 5 is opened, so that a ball 30 formed on a tip end of the wire 3 is bonded to the first bonding point A. Then, in step (b) of FIG. 3, the capillary 4 is vertically raised to a point B while the wire 3 is delivered. Thereafter, in step (c) of FIG. 3, a reverse operation of the capillary 4 is carried out, i.e. the capillary 4 is horizontally moved in a direction opposite from the second bonding point Z to a point C. As a result, a kink 3*a* is formed in the wire 3 in the same manner as in the conventional method.

Thereafter, the capillary 4 is vertically raised to a point D1 which may be selected as desired while the wire 3 is delivered. Then, important or characteristic steps of the embodiment of the present invention are performed. More specifically, in step (e) of FIG. 3, the capillary 4 is moved in a direction toward the second bonding point Z to a point D2 which is located almost immediately above the first bonding point A and of which the vertical and horizontal positions may be determined as desired. Subsequently, the wire 3 is bonded to a point M1 in such a manner that a part of the wire 3 is crushed together with a top portion of the ball 30 bonded to the first bonding point A. As the result of this operation, a crushed part 3*c* is formed in the wire 3 adjacent to the kink 3*a* while the kink 3*a* is formed into a shape in which the part of the wire 3 is doubled over. Then, in step (g) of FIG. 3, the capillary 4 is vertically raised to a point D while the wire 3 is delivered. In this instance, the capillary 4 may be slightly moved in a horizontal direction toward the second bonding point Z and then vertically raised to a point (not shown) which is slightly deviated from the point D. Alternatively, the capillary 4 may be obliquely raised to the slightly deviated point. Thus, in steps (e) and (f) of FIG. 3, the crushed part 3*c* is formed in the wire 3.

Then, in step (h) of FIG. 3, a second reverse operation of the capillary 4 is performed. That is, the capillary 4 is horizontally moved in a direction opposite from the second bonding point Z to a point E. The movement of the capillary 4 form the point D to the point E forms a kink 3*b* in the wire 3. Thereafter, in step (i) of FIG. 3, the capillary 4 is vertically raised to a point F so that the wire 3 is delivered by a length which corresponds to the inclined portion S of the wire 3 extending between the kink 3*b* and the lead 1*a*.

Subsequently, steps (j) and (k) of FIG. 3 are conducted in the same manner as that in the conventional method described above such that the capillary 4 is lowered to be located at the second bonding point Z, resulting in the wire 3 being bonded to the second bonding point Z. Incidentally, the movement of the capillary 4 from the point F to the second bonding point Z may be carried out along the same path as that in the conventional method described above, or may be suitably selected from various possible paths.

As described above, the second bonding of the wire 3 to the point M1 located almost the above the first bonding point A or in the vicinity thereof is carried out in step (f) of FIG. 3, not after the capillary 4 being merely raised as in step (b) of FIG. 3. Instead, the second bonding in step (f) of FIG. 3 is conducted after the capillary 4 is horizontally moved in the direction opposite from the second bonding point Z in step (c) of FIG. 3 and the kink 3*a* is formed in the wire 3 by performing steps (d) and (e) of FIG. 3, whereby the crushed part 3*c* is formed in the wire 3. As a result, the neck portion H is crushed or deformed to have a reduced height which is substantially equal to a height of the horizontal portion L per se extending between the kinks 3*a* and 3*b*, with the result that the wire loop having a low profile can be formed. For example, when a gold wire having a thickness of 25 μm is wire bonded to form a bonded part which has a diameter of about 60 μm and a thickness of about 12 μm, the neck portion H has a height of about 50-80 μm according to the present invention, whereas the neck portion H has a height of about 100-130 μm according to the conventional method. In addition, since the crushed part 3*c* of the wire 3 is bonded to the position M1 immediately above the first bonding point A, a rising part of the wire 3 from the first bonding point A is formed to be strong as compared to that of the conventional wire loop, with the result that a wire loop which is stably positioned and which has a strong shape retention can be formed.

Furthermore, in order to control the height of the neck portion H immediately above the first bonding point A or control a damage possibly caused to the neck portion H, the operations in steps (b) to (f) of FIG. 3 with respect to the point M1 immediately above the first bonding point A or the vicinity thereof may be repeatedly carried out twice or more times. Embodiments of wire loops formed by carrying out such wire bonding with respect to the first bonding point A a plurality of times are shown in FIGS. 4 and 5 by way of example.

Figure 4:
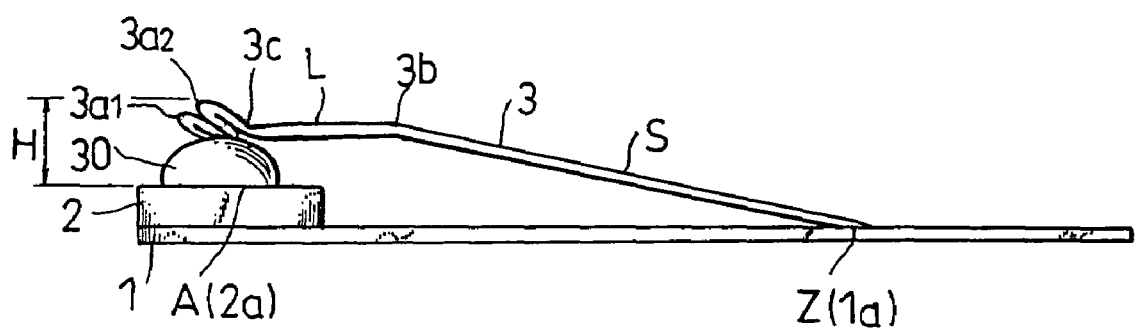
FIG. 4 is an elevational view showing a shape of another embodiment of a wire loop in a semiconductor device according to the present invention.

The wire loop shown in FIG. 4 is provided at the neck portion H with kinks $3a_1$ and $3a_2$ which are formed by varying a distance which the capillary 4 is horizontally moved in step (c) of FIG. 3. More specifically, the distance the capillary 4 is horizontally moved for forming the kink $3a_2$ is slightly shorter than that for forming the kink $3a_1$.

Figure 5:
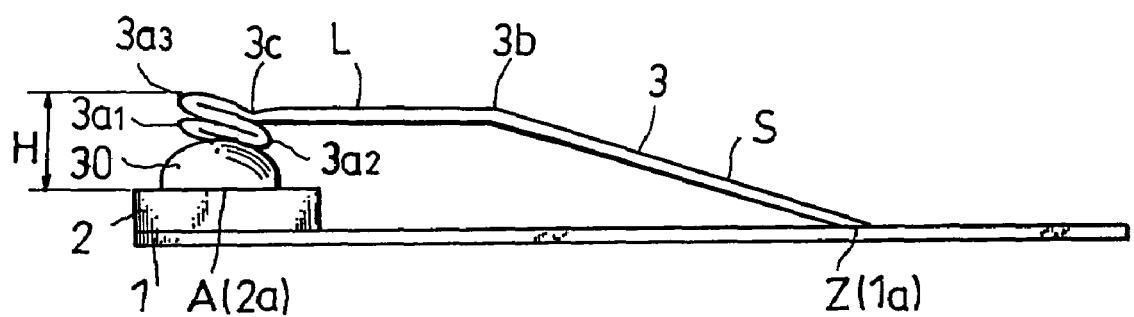
FIG. 5 is an elevational view showing a shape of still another embodiment of a wire loop in a semiconductor device according to the present invention.

The wire loop shown in FIG. 5 is provided at the neck portion H with three kinks $3a_1$, $3a_2$ and $3a_3$ which are formed by varying, in addition to a distance, a direction in which the capillary 4 is horizontally moved in step (c) of FIG. 3. The kinks $3a_1$ and $3a_3$ are formed by moving the capillary 4 in the same direction opposite from the second bonding point Z and different distances, whereas the kink $3a_2$ is formed by moving the capillary 4 in a direction toward the second bonding point Z in step (c) of FIG. 3.

As described above, in the embodiments of the wire bonding method according to the present invention, the bonding operation in accordance with steps (b) to (f) of FIG. 3 is carried out at least one time.

Figure 6:
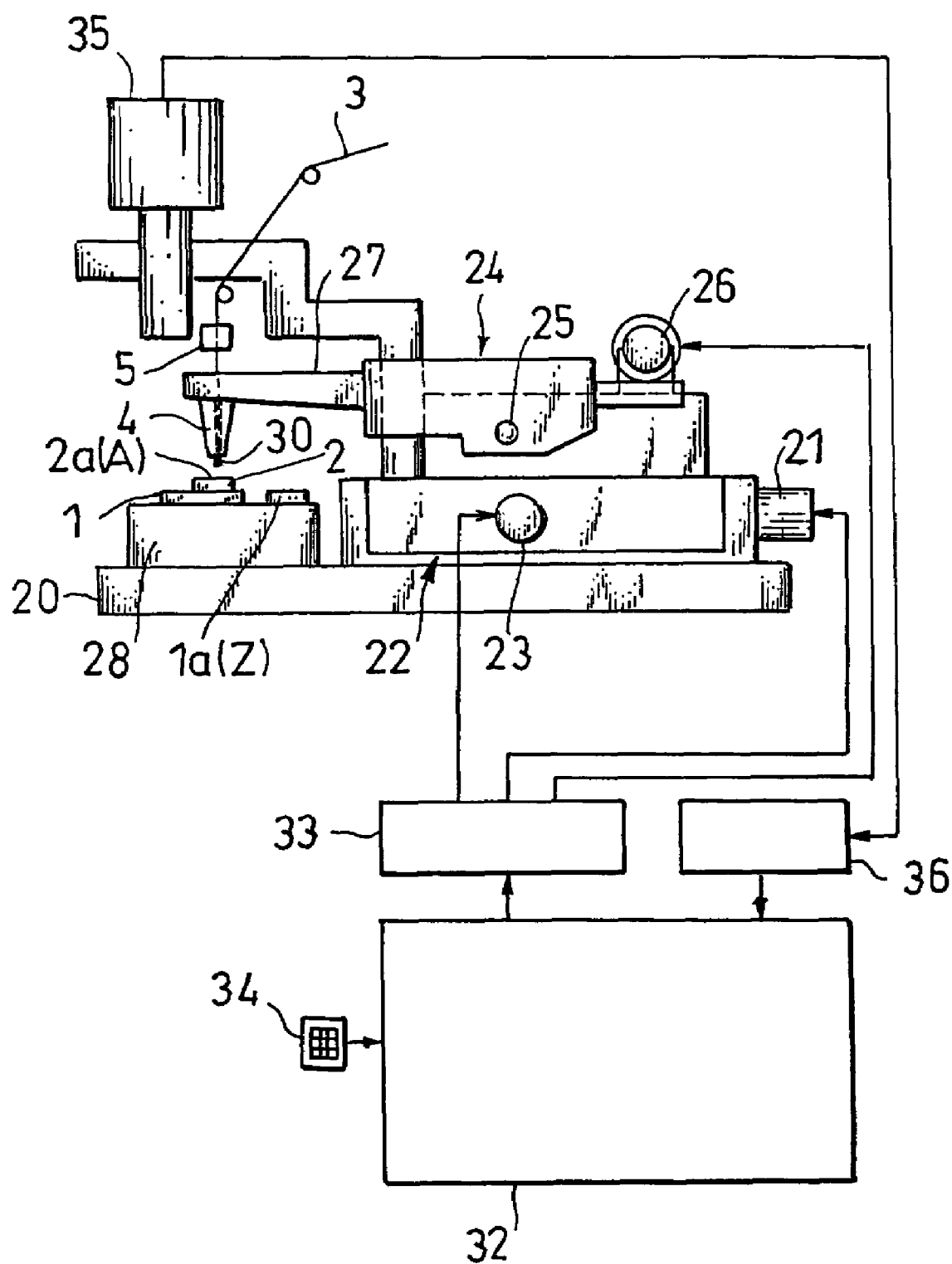
FIG. 6 is a block diagram showing an embodiment of a wire bonding apparatus according to the present invention.
Figure 7A:
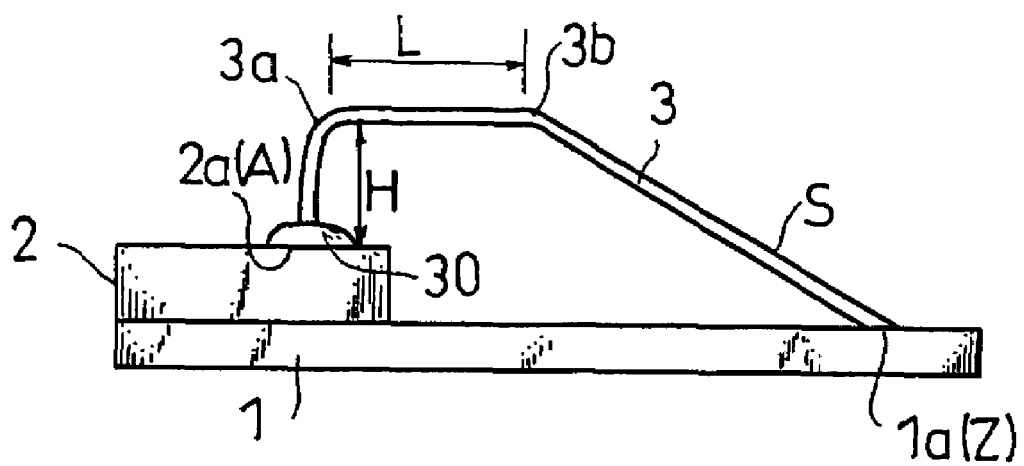
FIGS. 7A and 7B are elevational views showing conventional wire loops having a trapezoidal shape and a triangular shape, respectively.
Figure 7B:
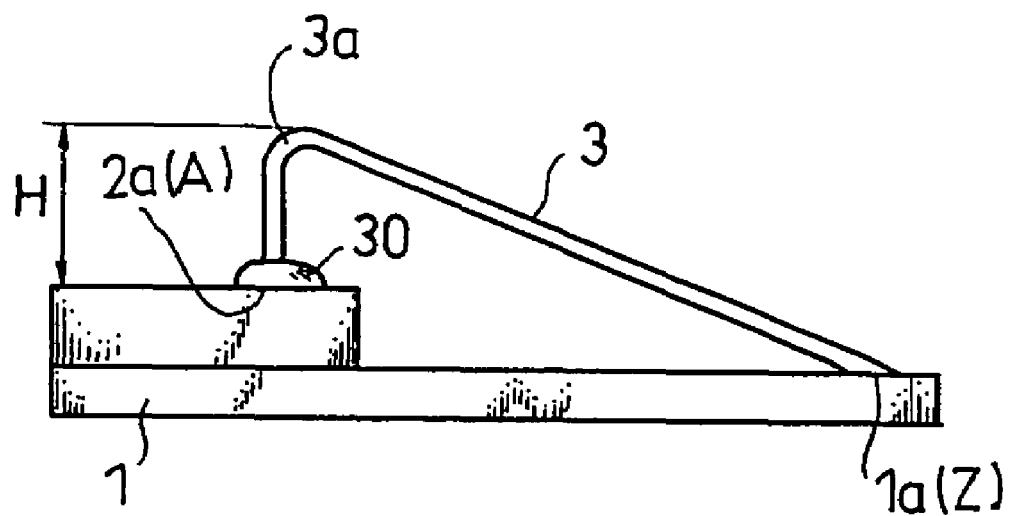

The bonding method of the present invention is performed, for example, by a wire bonding apparatus shown in FIG. 6. The bonding apparatus includes a base 20, an X-Y table 22 mounted on the base 20, a z-axis moving mechanism 24, a control unit 32 and a servo driving and controlling section 33 for controlling the X-Y table 22 and the z-axis moving mechanism 24 through x-, y- and z-axis motors 21, 23 and 26. The apparatus also includes a bonding stage 28 on which a lead frame 1 is placed. The z-axis moving mechanism 24 is provided with an arm 27 which has a capillary 4 attached to a distal end thereof while a wire 3 is inserted through the capillary 4. A clamp 5 is arranged above the capillary 4 so as to clamp and release the wire 3. Such construction permits the capillary 4 to be moved between a pad 2a (or a first bonding point A) of a semiconductor chip 2 attached to the lead frame 1 and a lead 1a (or a second bonding point Z) of the lead frame 1 while loop control is carried out. The z-axis moving mechanism 24 is supported by a pivot 25 such that the distal end of the arm 27 is vertically moved by the z-axis motor 26.

The control unit 32 is adapted to output a control signal to the servo driving and controlling section 33 on the basis of parameters which are previously set therein such that the servo driving and controlling section 33 moves the capillary 4 to and from the first and second bonding points A and Z along a predetermined path and operates the capillary 4 and the clamp 5. The control unit 32 is provided with a manual input section 34 attached thereto to input parameters, such as positions of the capillary 4 in horizontal and vertical direction during the wire bonding operation, in the control unit 32. Thus, the height of the capillary 4 to be raised is manually inputted into the control unit 32 through the manual input section 34, whereby the movement of the capillary 4 is automatically controlled. In FIG. 6, reference numerals 30, 35 and 36 denote a ball formed at a tip end of the wire 3, an ITV camera and an image recognition section, respectively.

The apparatus thus constructed suitably performs the wire bonding as described above with reference to the embodiment of the method of the present invention.

As can been seen from the foregoing, in the wire bonding method and the wire bonding apparatus, the wire loop connecting the first bonding point and the second bonding point therethrough is provided on the neck portion thereof with the crushed part which is formed by crushing a part of the wire in proximity to the neck portion together with the top portion of the ball bonded to the first bonding point. Such construction can provide a wire loop having a low profile which is stable and strong in shape retention. Such a shape of the wire loop can be readily obtained by, after bonding the ball of the wire to the first bonding point, raising the capillary slightly, carrying out loop control, and thereafter bonding the wire to the top or the vicinity of the top of the ball.

Therefore, not only a wire loop having a short wiring distance but also a wire loop having a long wiring distance can be obtained as a stable wire loop having a low profile. In addition, the wire loop thus formed has a strong shape retention which withstands a force or pressure exerting on the wire loop from outside. Therefore, the wire loop can perform an excellent shock absorbing function against a shock, such as a shock caused by contact of the capillary or emission of an ultrasonic wave during bonding the wire to the second bonding point, vibration of the wire, an external force generated by flow of a molding material during injection of the molding material and the like, with the result that bending or tilting of the wire and a breakage in the neck portion of the wire loop can be effectively prevented.

While preferred embodiments of the invention have been described with a certain degree of particularly with reference to the drawings, obvious modifications and variations are possible in light of the above teachings. It is therefore to be understood that within the scope of the appended claims, the invention may be practiced otherwise than as specifically described.

What is claimed is:

1. A wire bonding method for bonding a wire between a first bonding point and a second bonding point using a capillary, comprising the steps of:
   (a) bonding a ball formed on a tip end of the wire to said first bonding point;
   (b) moving said capillary horizontally and vertically while carrying out loop control, to thereby form a kink in a neck portion of the wire adjacent to said ball;
   (c) bonding the wire to a top or the vicinity of the top of said ball bonded to said first bonding point; and
   (d) thereafter, moving said capillary horizontally and vertically to said second bonding point while delivering the wire from said capillary and carrying out loop control, and then bonding the wire to said second bonding point;
   wherein the step (c) includes crushing a part of the wire and the top of said ball with said capillary to form a crushed part in the wire, and
   wherein the step (d) includes operating said capillary to form an additional kink in a portion of the wire located between said crushed part and said second bonding point.

2. The wire bonding method as defined in claim 1, wherein in the steps (b) and (c), said neck portion of the wire is doubled over to form said kink.

3. The wire bonding method as defined in claim 2, wherein the steps (b) and (c) are repeatedly carried out a plurality of times to form at least one additional doubled over kink in said neck portion.

4. The wire bonding method as defined in claim 1, wherein the steps (b) and (c) are repeatedly carried out a plurality of times to form at least one additional doubled over kink in said neck portion.

5. A wire bonding apparatus for carrying out a wire bonding method of claim 1, comprising:
   a capillary having the wire inserted therethrough to deliver the wire from said capillary;
   a clamp for releasably clamping the wire;
   a moving means for moving said capillary horizontally and vertically;
   a control unit for controlling the movement of said capillary; and
   a means for manually inputting height of said capillary to be raised into said control unit, whereby the movement of said capillary is automatically controlled.

6. The wire bonding method as defined in claim 1 wherein the step (c) includes crushing a part of the wire and the top of said ball with said capillary to form a crushed part in the wire so that said neck portion of the wire extends in one direction to approach said crushed part and the wire extends downstream from said crushed part in another direction to contact said second bonding point.

7. A wire bonding method for bonding a wire between a first bonding point and a second bonding point, comprising the steps of:
   bonding a first end of a predetermined length of wire to the first bonding point;

moving an adjacent portion of the wire relative to the first end in a first direction away from the first bonding point and subsequently bending the wire to extend back in a second direction over the first bonding point to contact the adjacent portion at the first bonding point, wherein the subsequent bending of the wire back in a second direction includes crushing the overlaying wire together with the adjacent portion of the wire;

forming a kink in a portion of the wire located between the crushed overlaying wire and the second bonding point;

moving a second end of the predetermined length of wire in a third direction to contact the second bonding point; and bonding the second end to the second bonding point.

8. The wire bonding method as defined in claim 7 wherein the wire is bent to overlap itself twice at the first bonding point.

9. The wire bonding method as defined in claim 7 wherein the first end has a ball formed on a tip of the first end for bonding.

10. A wire bonding method for providing a wire loop connector for electrical connection between a semiconductor device and a lead frame comprising the steps of:

providing a wire body of a predetermined length;

bonding a first end of the wire body to the semiconductor device;

moving an immediately adjacent portion of the wire body where the wire body is bonded to the semiconductor device to overlap and form a double overall thickness of the wire body at the electrical connection of the bonded first end;

forming a kink in the wire body between the wire body with the double overall thickness and a second distal end; and bonding the second distal end of the wire body for electrical connection with the lead frame having a thickness of the wire body wherein the height of the wire body relative to a distance above the semiconductor device is restricted.

11. The wire bonding method of claim 10 further including at the first end of the wire body a second overlaid length of the wire body wherein a thickness is quadruple the overall thickness of the wire body.

12. The wire bonding method of claim 10 wherein the wire body has been bent four times to integrally form an overall thickness with each bent length closed upon another length of the wire body.

13. The wire bonding method of claim 10 wherein the wire body with the double overall thickness is formed such that it extends in a first direction and the second distal end of the wire body extends in a second direction different from the first direction.

* * * * *